United States Patent [19]

Hsieh et al.

[11] Patent Number: 5,776,832

[45] Date of Patent: Jul. 7, 1998

[54] ANTI-CORROSION ETCH PROCESS FOR ETCHING METAL INTERCONNECTIONS EXTENDING OVER AND WITHIN CONTACT OPENINGS

[75] Inventors: Chia-Dar Hsieh, Tainan; Yun-Hung Shen, Taipei; Sheng-Liang Pan, Hsin-Chu; Jen Song Liu, Taipei, all of Taiwan

[73] Assignee: Taiwan Semiconductor Manufacturing Company Ltd., Hsin-Chu, Taiwan

[21] Appl. No.: 682,481

[22] Filed: Jul. 17, 1996

[51] Int. Cl.$^6$ .................................................. H01L 21/31
[52] U.S. Cl. .................... 438/669; 438/688; 438/720; 438/725
[58] Field of Search .................... 437/195, 192, 437/194; 156/643.1, 659.11; 438/669, 688, 720, 725

[56] References Cited

U.S. PATENT DOCUMENTS

| | | | |
|---|---|---|---|
| 5,017,513 | 5/1991 | Takeuchi | 437/228 |
| 5,294,292 | 3/1994 | Yamashita et al. | |
| 5,380,397 | 1/1995 | Fukuyama et al. | |
| 5,432,128 | 7/1995 | Tsu | 437/194 |
| 5,462,892 | 10/1995 | Gabriel | |
| 5,468,686 | 11/1995 | Kawamoto | 437/229 |

FOREIGN PATENT DOCUMENTS 6-104227   4/1994   Japan.

OTHER PUBLICATIONS

S. Wolf, Silicon Processing for the VLSI Era: vol. 2 (1990) Lattice Press, Calif. pp. 124–131.

*Primary Examiner*—Caridad Everhart
*Attorney, Agent, or Firm*—George O. Saile; Stephen B. Ackerman

[57] ABSTRACT

A method for anti-corrosion etching of metal interconnections, comprised in part of an aluminum layer, is achieved. The metal lines form self-aligned contacts (SAC) in contact openings in a polysilicon/metal dielectric (PMD) layer to a patterned underlying polysilicon layer. The method involves performing an oxygen ashing step in the same etching chamber immediately after etching the aluminum lines in a halogen gas, such as $BCl_3$ and $Cl_2$. This method using oxygen ashing avoids the use of the more traditional passivation gases $CHF_3$ and $CF_4$ which can overetch the polysilicon exposed in the SAC process that would cause electrical opens. And further, it avoids the formation of a polymer residue which is difficult to remove. The oxygen treatment reduces the $Cl_2$ on the sidewalls of the Al lines, and also removes portions of the photoresist mask material containing $Cl_2$. It is also easier to remove the remaining photoresist in a solvent stripping process. SEM measurements of the etch bias of the photoresist critical dimension also indicate the formation of a redeposition on the Al sidewalls which further protects the Al from corrosion when the wafers are removed from the etch chamber and are exposed to moisture.

18 Claims, 3 Drawing Sheets

ANTI-CORROSION ETCH PROCESS FOR ETCHING METAL INTERCONNECTIONS EXTENDING OVER AND WITHIN CONTACT OPENINGS

BACKGROUND OF THE INVENTION (1) Field of the Invention

The present invention relates to a method of etching metal interconnections extending over and within contact openings contacting polysilicon layers, and more particularly relates to a method for anti-corrosion etching of the aluminium interconnections while avoiding the overetching of the polysilicon in the contact openings.

(2) Description of the Prior Art

Patterned metal layers are used to provide interconnecting metal lines to wire up or interconnect semiconductor devices on substrates for integrated circuits. Typically the semiconductor devices are formed in part from patterned polysilicon layers. Although the patterned polysilicon layers can also be used to form some of the circuit interconnections, it is common practice in the industry to use one or more metal interconnecting levels to reduce the interconnect resistance and improve circuit performance. Typically the metal interconnection lines are formed from aluminium or aluminium-copper alloy because of its low resistivity.

An insulating layer is deposited over the patterned polysilicon layer to provide electrical isolation for the next level of metal interconnections. Openings are etched in the insulating layers to form the contact openings to the substrate, and to the underlying patterned polysilicon layer. A metal layer, typically composed of aluminium or aluminium-copper alloys, is deposited and patterned to form the interconnections extending over and into the contact openings. To provide the smallest metal pitch (center-to-center spacings between adjacent metal lines) and thereby increase the wiring density, the aluminum is patterned so that the metal lines are narrower than the width of the contact openings. This allows one to use more closely spaced contact openings which also increases the circuit density on the chip.

The aluminum is patterned by anisotropic plasma etching, rather than wet etching, to minimize the lateral etching, and thereby provide closer spaced metal lines and higher packing density.

The aluminum is typically plasma etched using an etchant gas containing chlorine, such as boron trichloride ($BCl_3$), carbon tetrachloride ($CCl_4$), silicon tetrachloride ($SiCl_4$) or chlorine ($Cl_2$). These etching gases are preferred because the etchant products in general are more volatile and more easily pumped from the etching chamber. However, some of the chlorine forms compounds (such as aluminum trichloride ($AlCl_3$)) that remain on the substrate, and more specifically on the aluminium sidewalls. Unfortunately, after removing the substrate from the etch chamber, the chlorine compound (e.g., $AlCl_3$) can hydrolyze forming hydrochloric acid (HCl) in the presence of moisture. The HCl can then dissolve the Al from the sidewalls, resulting in corrosion of the Al lines. One conventional method of preventing corrosion is to use carbon tetrafluoride/trifluoromethane ($CF_4/CHF_3$) as a final etching step to passivate the Al line. It is believed that the fluorine atoms replace the chlorine atoms thereby preventing corrosion. However, this passivation step also forms a polymer residue which makes stripping the photoresist layer used to pattern the Al lines difficult, and the $CF_4/CHF_3$ can also further etch away the underlying polysilicon lines in the contact openings forming electrical opens in the circuit.

One method of circumventing this chlorine corrosion problem is described by Fukuyama in U.S. Pat. No. 5,380,397 in which a halogen gas (Cl, Br, etc.) is used to etch the aluminum interconnections. After completing the etching, a treatment gas containing hydrogen ($H_2$) is used to remove the Cl residue on the sidewalls of the aluminum. Then the photoresist is removed by ashing in oxygen. In a second embodiment, Fukuyama uses hydrogen in the form of a water vapor in a post-etch treatment chamber to raise the pressure to condense the water vapor on the wafer, and then the chamber is evacuated to pump away the condensed water vapor that contains the dissolved Cl. The process is repeated several times to remove sufficient Cl contaminants. Another method is described by Gabriel in U.S. Pat. No. 5,462,892 in which after plasma etching the metal lines using a Cl-containing gas, the wafers are transported under vacuum to a second evacuated chamber where an oxide is formed on the sidewalls of the aluminum by heating the wafer while flowing a dry oxygen-containing gas. Another patent by Yamashita et al. (U.S. Pat. No. 5,294,292) teaches a method for stripping the photoresist in an oxygen plasma, but does not address the anti-corrosion issue.

It is still desirable to improve upon the methods for preventing the chlorine corrosion of the aluminum metal lines after plasma etching in chlorine that is both very manufacturable and cost effective.

SUMMARY OF THE INVENTION

It is therefore a principal object of the present invention to provide an anti-corrosion plasma etching process for etching aluminum interconnections.

It is another object of this invention to provide an anti-corrosive etching process which eliminates polymer residue that is formed during etching, and also avoids etching the underlying polysilicon lines in the contact openings that would otherwise occur when using $CF_4/CHF_3$ as the anti-corrosion gas during the plasma etching.

It is still another object of this invention to provide a passivation method which can be carried out sequentially in the same etching chamber that is used to etch the aluminum lines.

The present invention provides a method for anisotropic plasma etching aluminum interconnections, also referred to as aluminum lines, which in the final etching step uses an oxygen plasma ashing to prevent aluminum corrosion, and also eliminates polymer residue that is formed during etching. The method also allows the aluminum lines to be etched that are narrower than the width of the contact openings without overetching the underlying patterned polysilicon layer. This avoids forming electrical opens in the polysilicon lines.

The method begins by providing a semiconductor substrate having partially completed devices, such as field effect transistors (FETs) and bipolar transistors in which portions of the devices are formed by a patterned polysilicon layer. For example, the patterned polysilicon layer can be used to form the gate electrodes for field effect transistors (FETs) or bit lines on random access memory (RAM) devices, and for the polysilicon base or emitter on bipolar transistors. After forming the patterned polysilicon layer an insulating layer, typically referred to as the polysilicon/metal dielectric (PMD) layer, is deposited over the patterned polysilicon layer. For example, a low pressure chemical vapor deposition (LPCVD) can be used to deposit the insulating layer. Contact openings are now etched in the insulating layer down to the surface of the patterned polysilicon layer, for example, by anisotropic etching using an etchant gas such as trifluoromethane ($CHF_3$). A metal layer is deposited and patterned to form the metal interconnections. The interconnecting lines extend over and into the contact openings making contact to the patterned polysilicon layer. Typically, the metal layer consists of depositing first a barrier layer such as titanium/tungsten (TiW), and a highly electrically conductive metal, such as an aluminum alloy (AlSiCu). The metal layer is patterned using a photoresist mask and anisotropic plasma etching in an etching chamber using a chlorine-containing gas or gas mixture, such as boron trichloride ($BCl_3$) and chlorine ($Cl_2$). Typically these etchant gases result in the formation of $AlCl_3$ on the Al sidewalls which results in corrosion of the metal lines when the wafers are removed from the etcher and are exposed to moisture.

An important feature of the invention is the subsequent in-situ oxygen plasma ashing in the same etching chamber after etching the metal lines and prior to removing the wafers. This in-situ oxygen ashing in the same etching chamber passivates the aluminum sidewalls by reducing the chlorine on the aluminum sidewalls with oxygen and further forms a non-volatile deposition on the sidewalls to passivate the surface when the wafers are removed from the etcher and are exposed to moisture. The in-situ oxygen ashing after the metal etch partially strips the photoresist and changes the property of the metal sidewall polymer, which is now easier to strip in a solvent-stripping process. By this method, the need for using $CHF_3$ and $CF_4$ as a passivation step during the metal etch is avoided, thereby eliminating the possibility of overetching the underlying polysilicon layer that results in undesirable electrical openings. The oxygen plasma treatment at the end of the etching step also minimizes polymer deposits in the etching chamber.

BRIEF DESCRIPTION OF THE DRAWINGS

The objects and other advantages of the invention are best understood with reference to the preferred embodiments when read in conjunction with the following drawings.

DESCRIPTION OF THE PREFERRED EMBODIMENTS

Now in keeping with the objects of this invention, the method for anisotropic plasma etching aluminum interconnections (lines) having anti-corrosion properties is described in detail. The anti-corrosion, the removal of the polymer residue, and the avoidance of overetching the patterned polysilicon layer are achieved using the method of this invention. Although the method is applicable to forming interconnecting metal lines on integrated circuits having field effect transistors (FETs), such as dynamic random access memory (DRAM), static random access memory (SRAM), and microprocessors, it should be obvious to one skilled in the art that the method can be equally applied to contact openings on circuits having bipolar transistors formed from polysilicon emitters and bases. The method also allows the aluminum lines to be etched that are narrower than the width of the contact openings without overetching the underlying patterned polysilicon layer. This avoids forming electrical opens in the underlying polysilicon lines.

Figure 1:
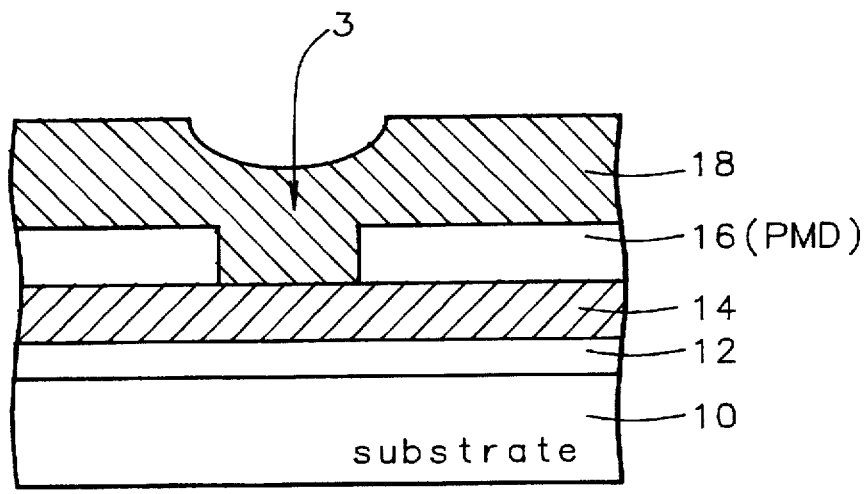
FIGS. 1-3 are schematic cross-sectional views of a portion of a substrate depicting the process for making metal interconnections by the method of this invention.

Referring now to FIG. 1, the method begins by providing a semiconductor substrate 10 having a partially completed circuit comprised of discrete devices. The devices are not depicted in the Figures to simplify the drawing and the discussion. An insulating layer 12, such as a Field OXide (FOX), formed on the substrate serves to electrically isolate the discrete device areas in which the FETs are formed, and also serves to provide electrical isolation on which the upper levels of electrical interconnections are formed. A polysilicon layer 14 is deposited on the insulating layer 12, and patterned to form portions of the discrete devices and to provide for local interconnections. Preferably layer 14 is deposited using low pressure chemical vapor deposition (LPCVD) using, for example, silane ($SiH_4$). The polysilicon layer is conductively doped with a P or N dopant to provide the desired polarity. For example, portions of polysilicon layer 14 can be P doped by using an appropriate implant block-out mask and implanting, for example, boron ions ($B^{11}$), and N doped regions of layer 14 can be formed in a similar fashion by implanting phosphorus ions ($p^{31}$). Typically the thickness of layer 14 is between about 3000 and 3500 Angstroms. Using conventional photolithographic techniques and anisotropic plasma etching, the polysilicon layer 14 is patterned to form portions of the device structure, such as gate electrodes, bit lines on random access memory (RAM) devices, and other polysilicon lines to provide electrical connections for the devices.

Still referring to FIG. 1, the patterned polysilicon layer is electrically insulated from the next level of metal interconnections by depositing a polysilicon/metal dielectric (PMD) layer 16. Preferably the PMD layer 16 is deposited, for example, using LPCVD and a reactant gas such as tetraethosiloxane (TEOS). Layer 16 is typically deposited to a thickness of between about 2500 and 3500 Angstroms.

Contact openings are now etched in the polysilicon/metal dielectric layer 16 to the surface of the patterned polysilicon layer 14. It should be understood that a multitude of contact openings are formed concurrently on the substrate, but only one such contact opening 3 is depicted in FIG. 1 to simplify the drawing and discussion. For example, the contact openings are formed by conventional photolithographic techniques and anisotropic plasma etching using an etchant gas, such as trifluoromethane ($CHF_3$).

A metal layer 18 is deposited and then patterned to form the next level (first level) of metal interconnections. Layer 18 is typically composed of a barrier metal layer, such as titanium/tungsten (TiW) and a low-resistive metal, such as aluminum or an alloy of aluminum, such as aluminum/silicon/copper (AlSiCu). The separate layers comprising layer 18 are not explicitly shown in FIG. 1. The barrier metal layer is deposited first and serves to prevent the aluminum from reacting with the underlying polysilicon layer 14. The barrier metal layer can be deposited by sputter deposition using, for example, a composite target composed of titanium and tungsten, and typically has a thickness of between about 1000 and 1200 Angstroms. The aluminum alloy is preferably deposited by sputter deposition using a composite target composed of Al, Si, Cu. Preferably, the AlSiCu alloy is deposited to a thickness of between about 8000 and 10000 Angstroms.

Figure 2:
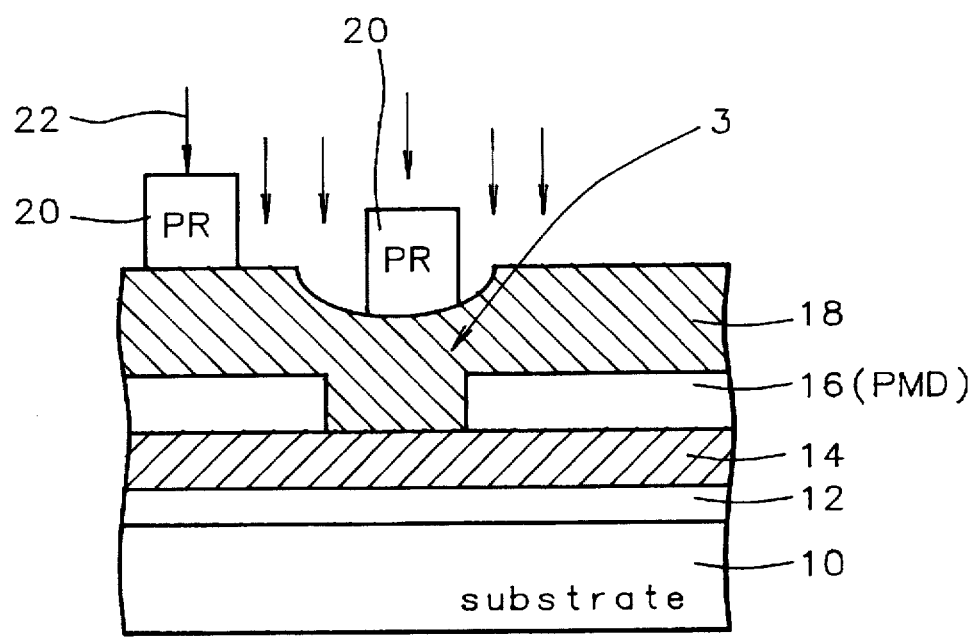
Figure 3:
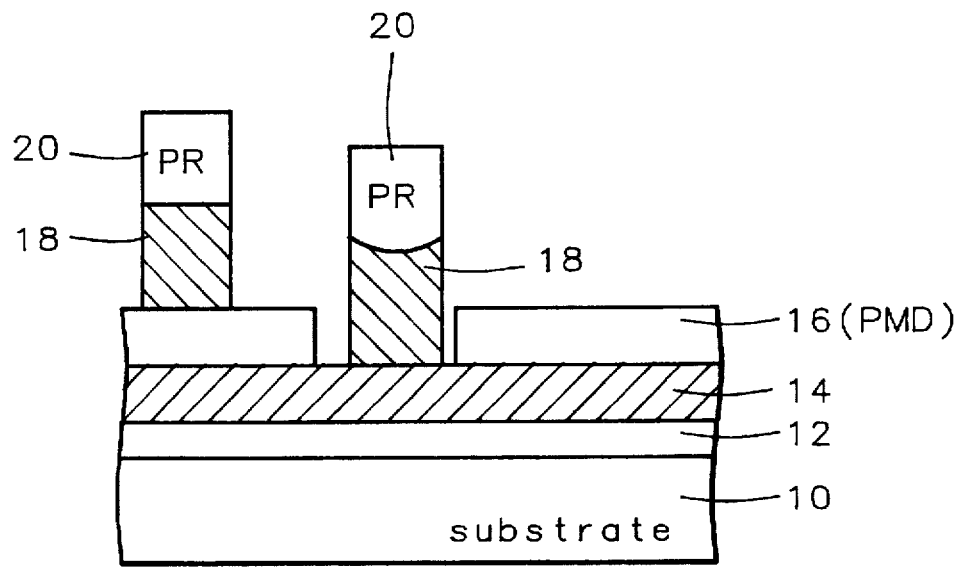
Figure 4:
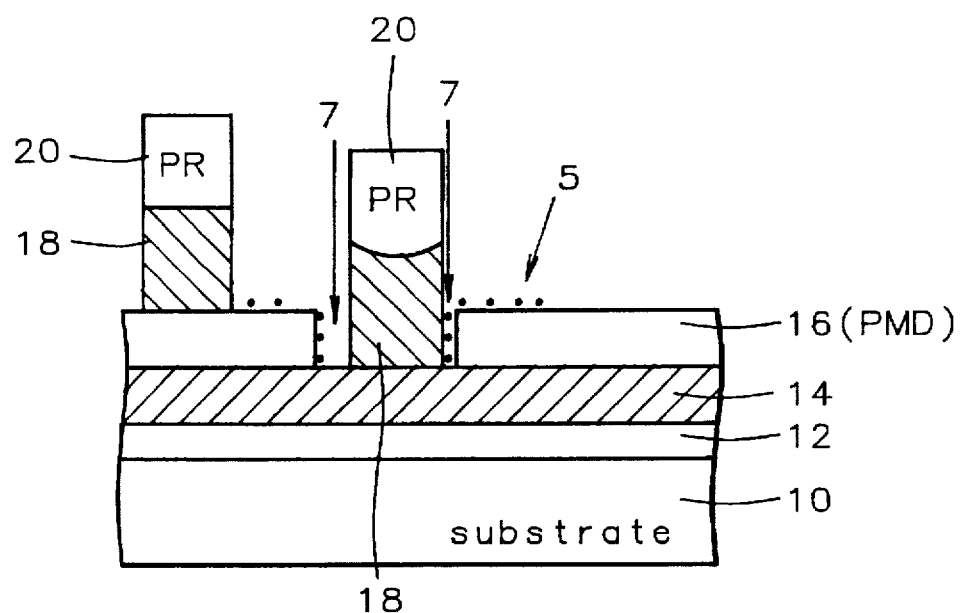
FIG. 4 is a schematic cross-sectional view of a completed metal interconnection with polymer residue and stringers prior to the oxygen plasma ashing step of this invention.

Referring to FIG. 2, a photoresist is applied to the substrate by spin coating and is subsequently exposed through a mask and developed to provide an etch mask 20 over portions of the metal layer 18 where the metal conducting lines are desired. As is also shown in FIG. 2, the photoresist is also patterned over the contact opening 3 to provide electrical contact to the underlying patterned polysilicon. And as is also shown, the width of the resist mask is narrower than the contact opening 3 to increase the metal line pitch and wiring density. One of the preferred photoresist types is a positive photoresist such as SPR-219, manufactured by Shipley Company of Japan. The metal layer is then patterned using the photoresist mask 20 and anisotropic plasma etched in a reactive ion etcher (RIE) or in a high-density plasma etcher. For example, the etching can be carried out using a Model 8330 etcher, manufactured by Applied Materials Company of U.S.A. Typically the aluminum etching is carried out using a chlorine-containing gas or gas mixture, such as boron trichloride ($BCl_3$) and chlorine ($Cl_2$). By way of example only, and more specifically, an etch process for patterning the metal layer which includes the oxygen passivation step of this invention, is detailed in Table I. As shown in Table I for etching the AlSiCu, the etching is initiated in step 1 by using $BCl_3$ at a flow rate of 150 standard cubic centimeters per minute (sccm) and $Cl_2$ at a flow rate of 10 sccm. The etching is carried out for about 2 minutes in the RIE mode with a DC bias of about −260 volts on the electrode in the etcher upon which the substrate is placed. In step 2 the etching is continued for about 18 minutes while maintaining the $BCl_3$ flow rate at about 150 sccm, increasing the $Cl_2$ flow rate to 65 sccm, and introducing $CF_4$ at a flow rate of 10 sccm, while holding the DC bias at about −220 volts. However, unlike the more conventional etch process of the prior art which uses $CF_4$ and $CHF_3$ to remove the residue and stringers 5 as depicted in FIG. 4, the present invention utilizes an oxygen plasma ashing (step 3) sequentially in the same etcher to effectively passivate the Al lines 18 (FIG. 3), thereby providing the anti-corrosion properties.

TABLE I

| Flow Rate (sccm) | Step 1 | Step 2 | Step 3 |
|---|---|---|---|
| 1 $CF_4$/Flow Rate | 0 | 10 | 0 |
| 2 $BCl_3$/Flow Rate | 150 | 150 | 0 |
| 3 $Cl_2$/Flow Rate | 10 | 65 | 0 |
| 4 $O_2$/Flow Rate | 0 | 0 | 80 |
| 5 Pressure (mTorr) | 25 | 30 | 150 |
| 6 RF Power (Watts) | 2300 | 2300 | 800 |
| 7 DC Bias (Volts) | −260 | −220 | 0 |
| 8 Etch Time (Mins) | 2 | 18 | 5 |

This $O_2$ ashing step (step 3) is carried out in the plasma mode (zero DC bias on the substrate) and provides several advantages over the prior art, which uses the $CF_4$ or $CHF_3$ the anti-corrosion gas to passivate the Al lines from chlorine corrosion. Preferably the $O_2$ ashing is carried out in pure oxygen at a pressure of between about 140 and 160 milliTorr using an oxygen flow rate of between about 70 and 90 sccm, and more specifically at a flow rate of 80 ccm. The radio frequency (RF) power during step 3, for this particular etcher, is maintained at between about 700 and 900 watts, and more particularly at a power of 800 watts.

There are several important features in the invention. In-situ oxygen ashing eliminates the need to use $CHF_3$ or $CF_4$ as the anti-corrosion gas in the traditional passivation step during metal etching. This eliminates the overetching in $CHF_3$ and/or $CF_4$ of the metal lines over the self-aligned contacts which would cause erosion and create electrical opens of the underlying patterned polysilicon layer 14 in the contact areas 7, as shown in FIG. 4. This also eliminates the formation of polymer residue 5 on the sidewalls of the aluminum lines by the $CHF_3$ which makes stripping the photoresist difficult. Further, the oxygen ashing passivates the sidewalls of the aluminum lines 18 (FIG. 3), which prevents the $Cl_2$ from causing corrosion for at least five days, which is as good as the traditional passivation. A portion of the photoresist mask, about 3600 Angstroms, is partially removed after the oxygen treatment. This essentially eliminates the chlorine residue within the photoresist mask, which is beneficial to the anti-corrosion properties. The removal of the plasma-hardened photoresist also makes it easier to strip the remaining photoresist mask during a solvent stripping process. The inclusion of the oxygen ashing step (step 3) also lessens the polymer formation in the etching chamber, providing for a cleaner process.

Figure 5A:
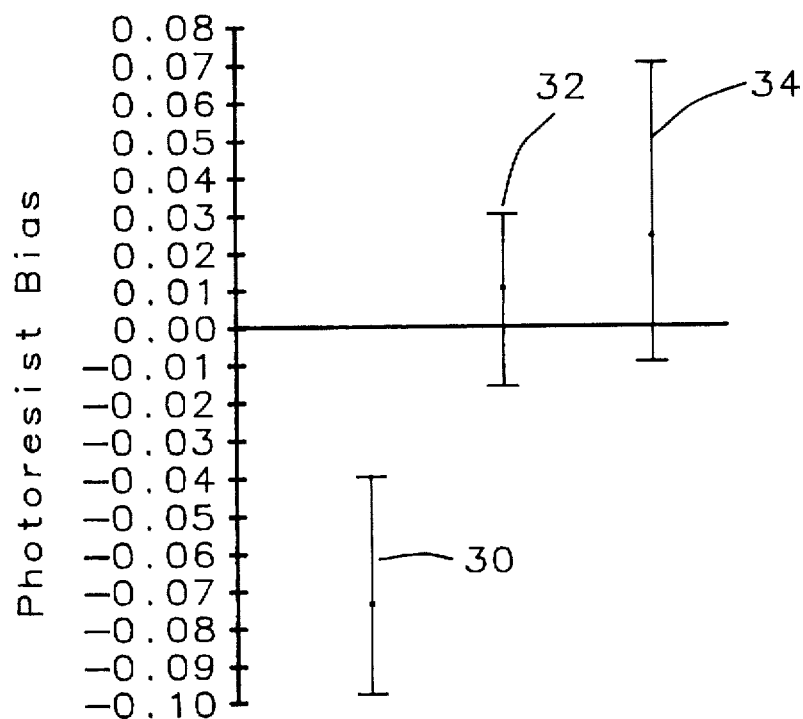
FIGS. 5A-5B show a graph of the photoresist bias for the critical dimension with and without oxygen plasma ashing, respectively.
Figure 5B:
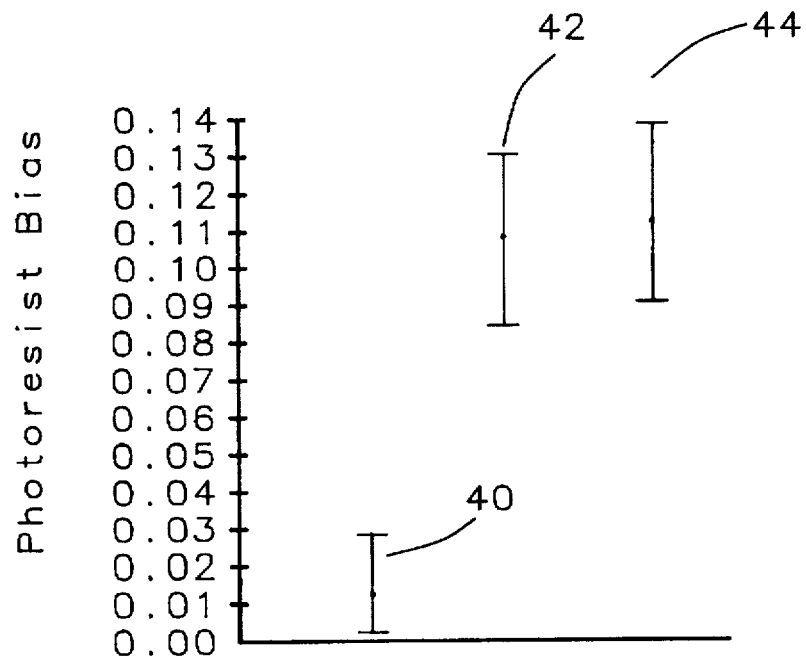

Referring to FIGS. 5A and 5B, the etching bias for the critical dimension (CD) of the photoresist mask after etching the Al lines without oxygen ashing is compared to the photoresist mask bias after etching the Al lines and performing a 5.0 minute oxygen ash, respectively. The bias for the critical dimension is determined using an in-line scanning electron microscope (SEM). The bias is determined by subtracting the measured critical dimension (CD1) prior to the oxygen ashing from the measured critical dimension (CD2) after oxygen ashing (CD bias=CD2−CD1). The photoresist bias in FIGS. 5A and 5B is measured in micrometers. Shown in FIG. 5A by data points 30 and 32 is the photoresist bias for measurements at different points on the product chip without oxygen ashing, and the data point 34 is a measurement of the bias at a test site on the same substrate. FIG. 5B shows the corresponding photoresist bias after a 5.0 minute oxygen ashing. The data points 40 and 42 are the critical dimension measurements at different points on the product chip, and the data point 44 is for the bias measured on a test site on the same substrate. Comparing FIG. 5A to 5B and noting the difference in scales between FIGS. 5A and 5B, it is clearly seen that the CD bias after oxygen ashing increases, which results in a buildup of a non-volatile redeposition that further protects the sidewall from moisture which would otherwise cause the corrosion of the aluminum in the presence of any remaining chlorine. The photoresist can now be effectively removed at a later date using a solvent stripping process without causing chlorine corrosion. On the other hand, the CD bias for the metal profiles with and without oxygen ashing (also measured by SEM) shows no significant difference.

While the invention has been particularly shown and described with reference to the preferred embodiments thereof, it will be understood by those skilled in the art that various changes in form and details may be made without departing from the spirit and scope of the invention.

What is claimed is:

1. A method for anti-corrosion plasma etching of metal interconnections for integrated circuits comprising the steps of:

providing a semiconductor substrate having a patterned polysilicon layer forming in part semiconductor devices and interconnections on said substrate;

depositing an insulating layer on said patterned polysilicon layer thereby forming a polysilicon/metal dielectric (PMD) layer;

etching contact openings in said insulating layer to said patterned polysilicon layer;

depositing a conformal metal layer over said insulating layer;

patterning said metal layer using a photoresist mask and anisotropic plasma etching in an etching chamber using chlorine-containing gas thereby forming interconnecting lines extending over and into said contact openings making contact to said patterned polysilicon layer; and further, in situ oxygen ashing at zero substrate bias in said etching chamber immediately after said patterning of said metal layer and prior to removing said substrate from said etching chamber, thereby passivating said metal interconnections by removing chlorine residue and removing residual polymers on said patterned metal sidewalls and further making removal of said photoresist masking easier in a solvent stripping process.

2. The method of claim 1, wherein said polysilicon layer is doped to make it electrically conducting.

3. The method of claim 1, wherein said polysilicon layer has a thickness of between about 3000 and 3500 Angstroms.

4. The method of claim 1, wherein said insulating layer is a chemical vapor deposited silicon oxide ($SiO_2$) having a thickness between about 2500 and 3500 Angstroms.

5. The method of claim 1, wherein said metal layer is a multilayer comprised of a barrier metal layer of titanium-tungsten (TiW) alloy and an aluminum layer thereon.

6. The method of claim 5, wherein said barrier metal layer has a thickness between about 900 and 1400 Angstroms.

7. The method of claim 5, wherein said aluminum layer has a thickness of between about 8000 and 12000 Angstroms.

8. The method of claim 1, wherein said chlorine-containing gas used to etch said metal layer is composed of boron trichloride ($BCl_3$) and chlorine ($Cl_2$).

9. The method of claim 1, wherein said in situ oxygen ashing is carried out in an oxygen plasma at a flow rate of between about 70 and 90 standard cubic centimeters per minute (sccm), and for a time of between about 4 and 6 minutes, and further said oxygen ashing is performed at a power of between about 700 and 900 watts at a pressure of between about 40 and 60 milliTorr.

10. A method for anti-corrosion plasma etching of metal interconnections for integrated circuits comprising the steps of:

providing a semiconductor substrate having a patterned polysilicon layer forming in part semicondluctor devices and interconnections on said substrate;

depositing an insulating layer on said patterned polysilicon layer thereby forming a polysilicon/metal dielectric (PMD) layer;

etching contact openings in said insulating layer to said patterned polysilicon/layer;

depositing a conformal metal layer over said insulating layer;

patterning said metal layer using a photoresist mask and anisotropic plasma etching in an etching chamber using chlorine-containing gas thereby forming interconnecting lines extending over and into said contact openings making contact to said patterned polysilicon layer, where said chlorine-containing gas is composed of boron trichloride ($BCl_3$) and chlorine ($Cl_2$); and further, in situ oxygen ashing at zero substrate bias in said etching chamber immediately after said patterning of said metal layer and prior to removing said substrate from said etching chamber, thereby passivating said metal interconnections by removing chlorine residue and removing residual polymers on said patterned metal sidewalls and further making removal of said photoresist masking easier in a solvent stripping process, wherein said in situ oxygen ashing is carried out at a pressure of 40 to 60 milliTorr at a flow rate of between 70 and 90 sccm.

11. The method of claim 10, wherein said polysilicon layer is doped to make it electrically conducting.

12. The method of claim 10, wherein said polysilicon layer has a thickness of between about 3000 and 3500 Angstroms.

13. The method of claim 10, wherein said insulating layer is a chemical vapor deposited silicon oxide ($SiO_2$) having a thickness between about 2500 and 3500 Angstroms.

14. The method of claim 10, wherein said metal layer is a multilayer comprised of a barrier metal layer of titanium-tungsten (TiW) alloy and an aluminum layer thereon.

15. The method of claim 14, wherein said barrier metal layer has a thickness between about 900 and 1400 Angstroms.

16. The method of claim 14, wherein said aluminum layer has a thickness of between about 8000 and 12000 Angstroms.

17. The method of claim 10, wherein said in situ oxygen ashing is carried out in an oxygen plasma for a time of between about 4 and 6 minutes, and further said oxygen ashing is performed at a power of between about 700 and 900 watts.

18. The method of claim 10, wherein said in situ oxygen ashing replaces the more conventional passivation using $CHF_3$ and $CF_4$, avoiding the overetching of said underlying patterned polysilicon exposed in said contact openings and thereby avoiding the formation of electrical opens in said patterned polysilicon layer.

* * * * *